United States Patent
Berman et al.

(10) Patent No.: US 6,837,967 B1
(45) Date of Patent: Jan. 4, 2005

(54) METHOD AND APPARATUS FOR CLEANING DEPOSITED FILMS FROM THE EDGE OF A WAFER

(75) Inventors: Michael J. Berman, Portland, OR (US); Steven E. Reder, Boring, OR (US); Rennie G. Barber, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 273 days.

(21) Appl. No.: 10/290,437

(22) Filed: Nov. 6, 2002

(51) Int. Cl.$^7$ .......................... H05H 1/00; H01L 21/00
(52) U.S. Cl. .................. 156/345.3; 156/345.33; 156/345.51; 118/728; 216/67; 438/710; 438/714
(58) Field of Search ................ 156/345.3, 345.51, 156/345.33; 118/728; 216/67; 438/710, 714

(56) References Cited

U.S. PATENT DOCUMENTS

| | | | | |
|---|---|---|---|---|
| 4,512,283 A | * | 4/1985 | Bonifield et al. | ........ 118/723 E |
| 5,246,532 A | * | 9/1993 | Ishida | .................. 156/345.46 |
| 6,364,957 B1 | * | 4/2002 | Schneider et al. | .......... 118/728 |
| 6,676,760 B2 | * | 1/2004 | Kholodenko et al. | ....... 118/728 |

FOREIGN PATENT DOCUMENTS

| | | | | | |
|---|---|---|---|---|---|
| JP | 61000577 A | * | 1/1986 | ........... C23C/14/34 |
| JP | 62128538 A | * | 6/1987 | ........... H01L/21/68 |
| JP | 62287072 A | * | 12/1987 | ........... C23C/14/34 |
| JP | 01230766 A | * | 9/1989 | ........... C23C/14/22 |
| JP | 03297124 A | * | 12/1991 | ......... H01L/21/027 |

* cited by examiner

Primary Examiner—Parviz Hassanzadeh
(74) Attorney, Agent, or Firm—Beyer Weaver Thomas

(57) ABSTRACT

A plasma edge cleaning apparatus is configured to remove film deposits from a wafer edge. A gas distribution manifold is annular shaped and positioned to provide plasma process gases near the edge of the wafer. A top insulator and a wafer support each include a magnetic coil to generate a magnetic field for shielding the selected portions of a wafer from the generated plasma. The top insulator is positioned above the wafer during edge processing so as to form a small gap between the top insulator and the wafer to prevent plasma from etching active die areas of the wafer.

26 Claims, 2 Drawing Sheets

METHOD AND APPARATUS FOR CLEANING DEPOSITED FILMS FROM THE EDGE OF A WAFER

BACKGROUND OF THE INVENTION

1. Field of the Invention

The present invention relates to methods and apparatus for cleaning deposits from a semiconductor wafer. More particularly, the present invention relates to the cleaning of deposited films and flakes from the edge portions of a semi-conductor wafer during the manufacture of semiconductor integrated circuits.

2. Description of the Related Art

Semiconductor wafer fabrication involves a series of processes used to create semiconductor devices and integrated circuits (ICs) in and on a semiconductor wafer surface. Fabrication typically involves the basic operations of layering and patterning, together with others such as doping, and heat treatments. Layering is an operation used to add thin layers of material (typically insulator, semiconductor or conductor) to the surface of the semiconductor wafer. Patterning is an operation that is used to remove specific portions of the top layer or layers on the wafer surface.

Once the integrated circuits on the wafer are completed, i.e., layering and patterning are implemented, the wafer is conventionally sliced into sections known as die. A large number of wafers are diced from a wafer, typically 100 to 1000. A wafer may comprise as many as 10 or more layers, each layer formed in a separate step. During processing of semiconductor wafers, films (i.e., layers) are deposited not only on the selected areas of the wafer surface designated for the die, but also on the margin of the wafer, i.e., the wafer edge and the bevel. The films may also be deposited on the backside of the wafer near the edge. These films located at or near the edge may become problematic during subsequent processing, such as occurring when the edge deposits begin to flake off. This may result in contamination during subsequent process steps. For example, such flakes may cause a bridge between two conductors or prevent the formation of a pattern. The flaking may therefore cause processing defects which may result in die failure at test.

The existing methods for resolving these problems are time consuming and expensive. One method involves etching away the outside edge area of the wafer by performing an additional etch processing step. For example, a separate resist coating, patterning, and etching step is often used to "clear" the edge portion of the wafer. This step is expensive, and often the equipment used is designed for high precision layouts. Such precision is unnecessary for low precision edge clearing work and hence adds to the cost of fabricating the wafer. In addition, steps are also included in the process that are specifically designed for wafer backside cleaning.

The front side, edge, and backside cleaning steps are typically performed in a wet process etch. But the existing techniques are not always effective in removing all deposits. Any films remaining on the edge of the wafer will tend to flake off. Moreover, wet processing requires the use of very expensive wet process tools. Wet cleaning of the wafers is also labor intensive and hazardous to the workers. Waste generated from the process is difficult and expensive to deal with.

Unfortunately, there is no conventional process that is currently specifically directed to removing films from the edge and bevel of the wafer. Accordingly, it is desirable to provide a more effective method and apparatus for removing films from the bevel and edge of a wafer.

SUMMARY OF THE INVENTION

To achieve the foregoing, the present invention provides methods and apparatus for cleaning the edge of a wafer during the manufacture of semi-conductor integrated circuits. A plasma processing apparatus is constructed with a plasma gas manifold (e.g., a gas distribution plate for distributing plasma) positioned near the edge of the wafer. The gas distribution manifold is configured in a ring or annular shape. The plasma created using gases discharged from outlet holes or apertures in the gas generator is directed to the edge portions of the wafer. A combination of a top plate and a wafer support, each of the two having a magnetic coil for generating a magnetic field, helps confine and direct the plasma toward the edge portions of the wafer and away from shielded portions of the wafer. In one embodiment, an inert gas outlet tube discharges an inert gas in the center portion of the top plate in order to create a positive pressure over the shielded portions of the wafer.

With this configuration, the plasma generated may be localized to the desired edge regions of the wafer, i.e., the "edge exclusion area". Moreover, the plasma operation directed to the edge exclusion area may be performed using tools that are less critical. That is, since the dimensions of the edge exclusion area are less critical than etched features in the circuit portions of the wafer, photolithography and etching steps tailored for high precision layouts may be avoided in the low precision edge etching.

According to one aspect of the present invention, a plasma apparatus for generating a plasma to remove film deposits from a wafer edge includes a wafer support having a first magnetic field generating source for directing plasma toward the edge of a backside (i.e., bottom) surface of a wafer. The plasma apparatus includes a top insulator for shielding active die portions of an active surface of a wafer from a plasma and having a second magnetic field generating source for directing plasma away from central portions of the wafer and towards the wafer edge. The plasma apparatus further includes an annular shaped gas distribution manifold to direct generated plasma to the edge of the wafer. The first and second magnetic fields are magnetic confining fields and in one aspect are created by adjustable magnets.

According to another embodiment of the present invention, the gas distribution manifold comprises a plurality of apertures for directing plasma process gases towards the wafer edge. The plurality of apertures may be angled to direct process plasma gases to one of a top edge, backside edge, and a bevel area of the wafer.

According to yet another embodiment of the present invention, the top insulator plate comprises an inert gas port for providing an inert gas to provide a positive pressure relative to the edge region of the wafer to shield selected areas of the wafer from plasma.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides improved methods and apparatus for cleaning and etching the edge of a wafer during the manufacture of semiconductor integrated circuits. A typical objective is to clear a 2 mm portion from the edge of the wafer inward. A plasma process ng apparatus in accordance with one embodiment of the present invention is constricted with a gas distribution manifold in a ring or annular configuration positioned to direct plasma near the edge of the wafer. The plasma created using gases discharged from outlet holes or apertures in the gas manifold is directed to the edge portions of the wafer. A combination of a top plate and a wafer support, each of the two having a magnetic coil for generating a magnetic field, helps confine the plasma to the edge portions of the wafer. That is, the magnetic confining field generated directs the plasma to the edge of the wafer, the bevel of the wafer, and a limited portion of the top and backside surfaces of the wafer near the edge of the wafer. In one embodiment, an inert gas outlet tube discharges an inert gas in order to create a positive pressure over the shielded portions of the wafer, and thus to minimize stray plasma from etching the die portions of the wafer. By using the directed and magnetically confined methods and apparatus of the present invention, the edge portions of the wafer may be etched without generating hazardous liquid wastes as in wet processing and without requiring the combined photo, patterning, and etching steps using the conventional technology.

Figure 1:
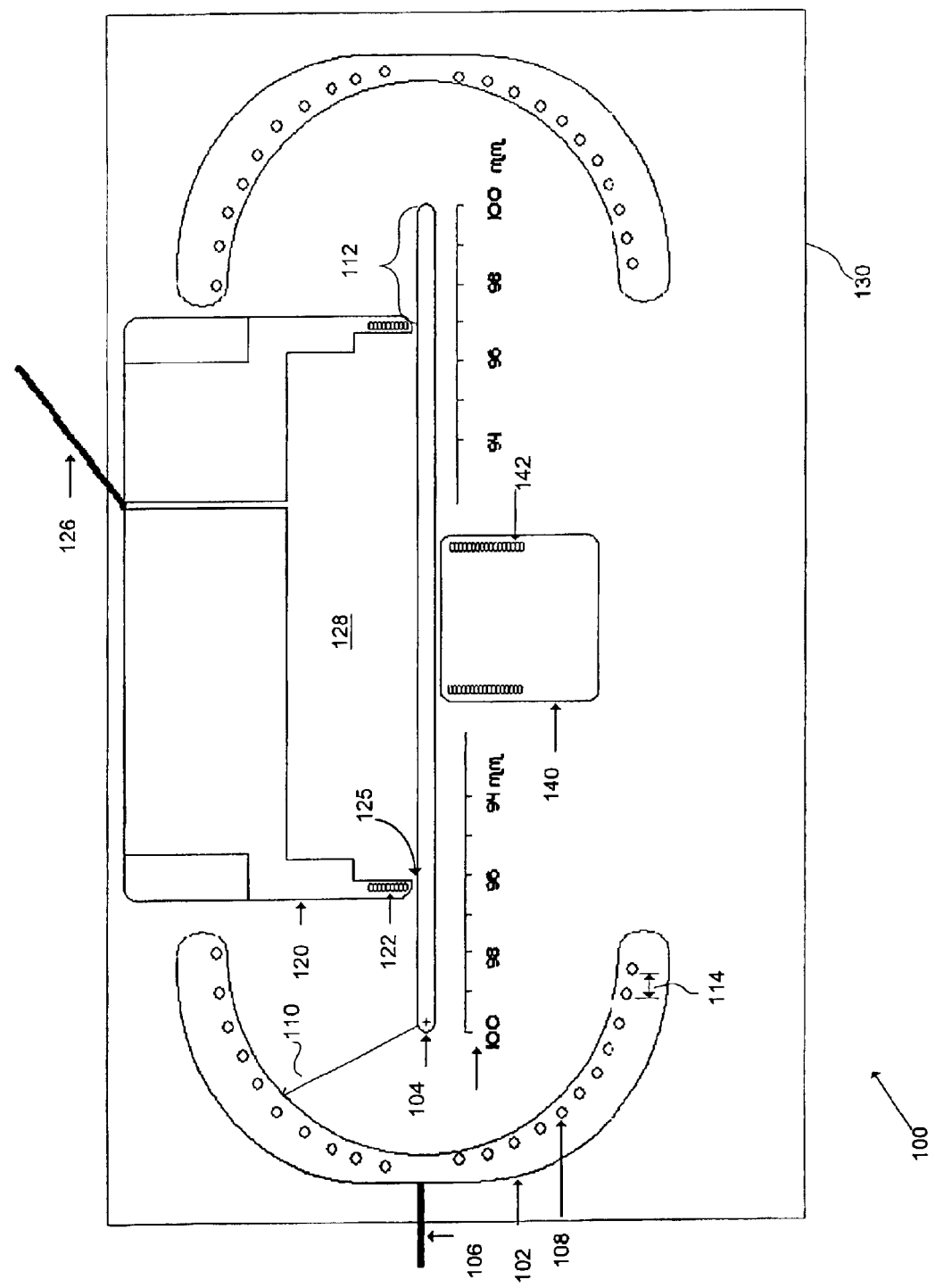
FIG. 1 is a diagrammatic cross-sectional view of a plasma processing apparatus in accordance with one embodiment of the present invention.

FIG. 1 is a diagrammatic cross-sectional view of a plasma processing apparatus 100 in accordance with one embodiment of the present invention. The features and dimensions of the plasma processing apparatus have been exaggerated for purposes of discussion and illustration and accordingly are not to scale. The plasma processing apparatus 100 includes a gas manifold 102 configured to direct process gases to the edge areas of wafer 104. The gas manifold is annular shaped and positioned and sized so that plasma generated is directed to the edge regions of the wafer. In a preferred embodiment, the gas manifold 102 is toroidal shaped, such as illustrated in cross-sectional view in FIG. 1.

Attached to the gas manifold 102 is a process gas inlet port 106 for injecting process gases into the gas manifold. Although a single inlet port is illustrated, the invention is not so limited. For example, multiple gas entry ports may be positioned around the gas manifold 102 to balance gas flows and pressures in the gas manifold 102. That is, multiple gas entry ports may be used to maintain uniform gas pressures in the gas manifold 102 and thus provide more uniform etching of the wafer edge regions. Suitable gases for excitation into a plasma are known to those of skill in the art and thus further description is deemed unnecessary. Examples of such gases include, but are not limited to, oxygen, chlorine or hydrogen bromide.

In one preferred embodiment, the gas manifold 102 comprises a plurality of apertures 108, positioned on the surfaces of the gas manifold 102 facing the wafer so as to direct the plasma toward the wafer edge regions. The size and spacing of the apertures 108 is not specifically limited, but dependent upon the size and configuration of the gas manifold 102, the process gas flow rates and pressures and other parameters of the plasma process. For example, in one embodiment, the gas manifold 102 is a toroid having a "C" shaped cross section (as illustrated in FIG. 1). Such a shape is advantageous in directing the plasma to the selected edge portions of the wafer. As shown, the inner portion of the toroidal shaped gas manifold 102, i.e., the circular surface facing the wafer, preferably has a radius of curvature 110 small enough to direct the plasma gases through apertures 108 towards the wafer edge exclusion area yet large enough to provide clearance between the wafer 104 and the gas manifold 102. This clearance not only avoids physical damage to the wafer but also allows ionization of the plasma gases when the gas manifold 102 is functioning as an electrode.

The dimensions of the radius of curvature 110 are dependent upon the size of the edge exclusion region 112. For example, where the edge exclusion region 112 is defined by a dimension x (i.e., x representing the distance from the edge of the wafer inward to be cleared), a preferable radius of curvature 110 lies in the range from 2x to 6x. For example, where the edge exclusion region is defined to be 2 mm, radius 110 preferably lies in the range of 4 to 12 mm. While preferable, these dimensions are not intended to be limiting. Moreover, it should be recognized that the inner surface of the gas manifold 102 is not limited to a circular surface. Curved surfaces, for example having different radii of curvature along the length of the inner surface would also be suitable. In other embodiments, flat inner surfaces may be employed without departing from the spirit or scope of the present invention.

It should be noted that in this embodiment, the gas manifold 102 not only serves as a gas distribution manifold but also serves as the anode. That is, the gas manifold 102 is an electrode, electrically connected to an RF (radio frequency) power source (not shown). Hence, adequate clearance is necessary to avoid charging the wafer 104 with the RF voltage and thereby damaging the wafer. The power source preferably operates at 13.56 Mhz, but may have a frequency anywhere in the range of 1 to 100 Mhz., as is known to those of skill in the relevant art. The power applied is process dependent but suitable powers, for example, lie within the range of 500 to 5000 watts for an 8 inch diameter (200 mm) wafer. Power may be ac or dc.

Various embodiments of the plasma processing apparatus are illustrated in FIGS. 2A–2D for allowing the wafer to be loaded into the plasma processing apparatus 100, such as by forming the toroid gas manifold 102 in two or more split sections, for example forming the toroid in a so called "clamshell" configuration, i.e., two curved surfaces hinged to form a closed ring. Alternatively, the two or more sections may be joined by fasteners without using hinges. These configurations, as described in greater detail below, enable the wafer to be loaded into and out of the plasma processing apparatus while preserving the close clearance between the gas manifold and the wafer.

The apertures 108 may be any size, spacing, and number which suitably directs the plasma towards the edge exclusion area 112. For example, suitable diameters of the apertures are expected in the range from 0.1 to 3.0 mm, more preferably in the range from 0.5 to 2.0 mm. In an alternative embodiment, the apertures 108 are tapered in diameter along the radius 110 to produce an equal or uniform dispersion of process gases. That is, the diameters of the apertures 108 may be increased in size as the distance from the gas inlet port 106 increases, to account for pressure losses in the gas manifold 102. In yet another alternative embodiment, the spacing 114 between adjacent rows of apertures may be decreased as the distance from the gas inlet port 106 increases. In this manner, a controlled or uniform flow rate of plasma gases may be achieved and thus uniform etching of deposited layers in the edge exclusion region.

It should be noted that in FIG. 1, the gas manifold 102 is shown in cross-section. Each aperture shown in the cross-section may be representative of a row of apertures, the rows extending in a separate plane essentially parallel to the active (i.e., top) surface of the wafer 104. The apertures may also be aligned in a vertical plane (i.e., perpendicular to the wafer top surface). These examples are illustrative and not intended to be limiting. For example, the rows may alternatively be staggered so that apertures in one row fall between apertures in adjacent rows. The materials used to construct the gas manifold are not particularly limited. For example, while not intending to be limiting, stainless steel, aluminum, and quartz are suitable for use in the gas manifold 102.

As noted earlier, in clearing the edge of the wafer of deposited films or flakes, an approximate 2 mm section maybe set as the edge exclusion area 112. That is, the cleaning or etching process is set up to clear this region, as measured from the edge of the wafer inward. This region includes the beveled portion of the wafer, which typically lies in the outer 0.5 mm of the wafer in accordance with SEMI (Semiconductor Equipment and Materials International) Standards. In a preferred embodiment, the etch exclusion area is set on the front side of the wafer in the range from 1.5 to 4 mm. Smaller edge exclusion areas are advantageous in preserving more area of the wafer for die production. Also in a preferred embodiment, the backside wafer edge exclusion region, i.e., the area on the back of the wafer etched using the apparatus and methods of the present invention, is set in the range from 3 to 4 mm. These dimensions are illustrative only and not intended to be limiting. Further, the scale superimposed on FIG. 1 is intended to provide a relative reference for a sample edge exclusion region in comparison to a 200 mm wafer and is not intended to provide any other size reference or in any way limit the invention. As noted above the drawing is not to scale. It will be appreciated by those of skill in the relevant art that the concepts, apparatus, and methods of the present invention can be modified to accommodate smaller and larger edge exclusion areas without departing from the spirit and scope of the present invention.

Configured in a position directly above the active surface of the wafer 104 is a top plate 120 for shielding the active die from the plasma. As further illustrated in FIG. 1, the top plate 120 in one embodiment is a cylindrically shaped insulator and has located at its periphery a plasma confining top magnetic coil 122 for directing the plasma to the edge exclusion region 112. The top plate 120 may be constructed from any suitable insulating materials providing sufficient rigidity and heat tolerance sufficient for the relatively high temperatures found in plasma processes. For example, ceramic or silicon carbide are suitable materials. These are intended to be illustrative and not limiting. The top plate 120 is positioned so as to provide a gap 125 between the top plate 120 and wafer 104 when the wafer is in position to perform etching of the edge exclusion region. The gap 125 is important to avoid physical damage to the sensitive active surface of the wafer 104. Preferably the gap 125 lies in the range of 0.5 to 5 mm and is designed to shield the active die from the plasma. Too large a gap will reduce the effectiveness of the top plate in shielding of the active die and as a result the cleaning plasma will etch the circuitry on the active die. Too small a gap may result in physical damage to the sensitive pattern lines on the active area of the wafer. It should be noted that the wafer 104 may be held in a stationary position or may be rotating, according to the process method selected. For the rotating embodiment, the gap 125 should be sufficient to accommodate deviations of the wafer from a nominal height as the wafer rotates.

This embodiment of the present invention also utilizes a plasma confining top magnetic coil 122 located in the top plate 120 to create magnetic fields for control of the plasma directed to the top surface of the wafer 104. The top magnetic coil 122 is connected to a variable dc power supply (not shown) in order to create the plasma confining magnetic field. Preferably, the plasma may be "moved" by varying the magnetic forces by manipulation of the supply current. Thus, the location of the plasma etching maybe controlled. In one embodiment, the top magnetic coil 122 is a single electromagnetic coil extending around the periphery of the top plate 120. In other embodiments, the magnetic coil may be split into two or more sections, for example, to facilitate construction of the top plate 120 or to correspond to multiple sections used for forming the gas manifold 102, as further described and illustrated with reference to FIGS. 2A–2D.

In one optional embodiment, the effectiveness of the top plate 120 in shielding the active die from the plasma is supplemented by the "back" pressure created by the injection of an inert gas through inert gas port 126. Inert gas port 126 permits inert gases to be channeled into the top plate 120 into top plate chamber 128 to discourage plasma gases from being introduced into areas where etching is undesirable, i.e., the active die area of the wafer. Suitable inert gases will not react with the plasma species gases and are dependant upon the plasma process selected. For example, helium or other noble gases have been used as an inert gas in reactive ion etch processes. Non-corrosive and low atomic weight gases are most suitable. The selection of suitable inert gases may be performed by one of skill in the relevant art and therefore further description is believed unnecessary. Preferable flow rates for the inert gases range from 1 to 2000 sccm. Suitable static presssures in the top plate chamber range from 1 mTorr to 25 Torr.

The plasma processing apparatus 100 also includes a plasma chamber 130 for maintaining appropriate pressures for the plasma operation. The interior of the plasma chamber is maintained in a vacuum condition by a vacuum pump (not shown) at a pressure varying in the range from 1 mTorr to 100 Torr, depending upon the plasma process. For example, reactive ion etching (RIE), downstream plasma, and direct plasma are just three examples of plasma processes. Direct plasma generally involves pressures at the low end of this range whereas RIE plasma involves pressures at the high end. The present invention in various embodiments may be implemented with any of the different kinds of plasma processes. Volatile products of the plasma etching process may be removed from the chamber through the vacuum port.

The wafer 104 is supported by wafer chuck 140, which holds the wafer during processing. The chuck material may be any suitable material, for example anodized aluminum or ceramic. The wafer chuck holds the wafer 104 by vacuum or electrostatic pressure or other methods known to those of skill in the relevant arts. The wafer chuck 140 includes a magnetic field generating source such as chuck magnetic coil 142. The magnetic coil 142 will be suitably placed within the chuck, for example in a machined recess within the chuck and electrically insulated from conductive materials used in the chuck 140. It should be noted that FIG. 1 illustrates the chuck in cross section. Chuck magnetic coil 142 extends around the periphery of the chuck and may produce a fixed or variable magnetic field for magnetically confining the plasma. That is, the magnetic field produced by the chuck magnetic coil 142 directs the plasma away from the center of the wafer, specifically to control etching on the backside of the wafer. The magnetic field may be adjusted by varying the current through the magnetic coil 142. Magnetic coil 142 is preferably connected to a separate dc power supply (not shown) from the top magnetic coil 122 so as to provide independent control of the magnetic fields as applied to the front and back sides of the wafer 104.

Although both the top magnetic coil 122 and the chuck magnetic coil 142 have been described as having adjustable characteristics, the invention is not so limited. Either or both may be implemented with fixed values, i.e., with a fixed dc current supplied or yet in another alternative embodiment, replaced with a series of fixed magnets, without departing from the scope of the present invention. With this arrangement, the plasma may be directed to etch the desired region at the margin of the backside of the wafer in a controlled manner. According to conventional methods, etches performed on the back side of the wafer have typically etched from the edge of the wafer 7 to 8 mm inward. The configuration of the present embodiment enables control of the backside etch to the same sized regions or even smaller or larger regions, by making suitable adjustments of the magnetic confining field generated or suitable selecting fixed magnets or electromagnets for positioning at the periphery of the wafer chuck 140. For example, the backside etch region may preferably be confined to 3 or 4 mm to minimize backside flaking. In alternative embodiments, the magnetic field may be created by the use of any magnetic field generating source.

By using independent power supplies for the electromagnets, and by varying the currents in the top magnetic coil 122 and chuck magnetic coil 142, the magnetic fields generated may separately be controlled and may independently provide plasma etching for different distances on the top and backside surfaces of the wafer 104. That is, for example, the top surface of the wafer may have an etch exclusion region having a width of 2 mm whereas the back side of the wafer may be etched for a different distance from the edge, for example 8 mm. Further, it will be recognized that using techniques known to those of skill in the art, a common power supply for the magnetic fields may be used but modified with appropriate current limiting devices to provide different currents to the top magnetic coil 122 and the chuck magnetic coil 142, and hence different magnetic fields, without departing from the scope or intent of the present invention.

During plasma etching, such as occurring in RIE (reactive ion etching) process, a plasma is formed above the wafer by imparting large amounts of energy to process gases at low pressures. As described above, the gas manifold in one embodiment is connected to an RF power source and functions as one of the electrodes (the anode). The plasma is created by applying the potential across the electrodes, the second electrode in this embodiment comprising the support for the wafer, i.e., the wafer chuck. The wafer chuck is grounded and functions as the cathode. It should be noted that different plasma applications and processes form plasma in different ways. Thus, the above example is intended to be illustrative and not limiting. For example, as an alternative to the electrostatic coupling described above, RF energy may be transferred to a plasma by inductive coupling. Further, the process gases may be ionized and then accelerated downstream to the wafer in downstream plasma methods. The scope of the present invention is intended to be extended to all forms of plasma. For example, the apparatus of the embodiment described and illustrated in FIG. 1 may be adapted to a downstream process by forming the plasma in a separate chamber upstream of the plasma chamber 130 in which the edge etching is performed.

Figure 2A:
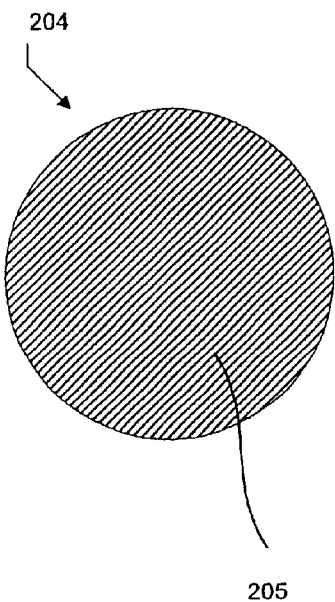
FIGS. 2A–2D are diagrams illustrating top views of a mounted wafer and a plasma processing apparatus in accordance with one embodiment of the present invention.
Figure 2B:
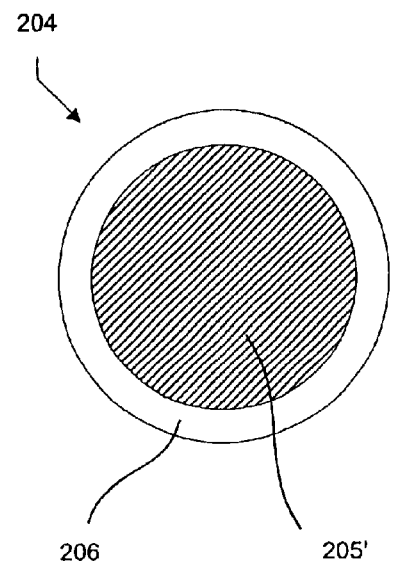

FIGS. 2A–2D are diagrams illustrating top views of a mounted wafer and a plasma processing apparatus in accordance with one embodiment of the present invention. FIG. 2A shows the wafer 204 with the surface fully covered with a film 205. FIG. 2B illustrates the wafer 204 after the edge etch has been performed, with the edge exclusion area 206 at the margin of the wafer 204 and the film 205' (after edge etch) covering the remainder of the wafer 204. The processing of a semiconductor wafer typically involves 10 or more layers or steps. The edge exclusion etching in accordance with embodiments of the present invention may occur after each step or more preferably after 2 or 3 layers or steps have been completed in order to reduce the number of steps in the overall process. In an alternative embodiment, the edge etching may take place after selected layers have been deposited, preferably those layers known or expected to produce conditions likely to result in flaking or peeling.

Figure 2C:
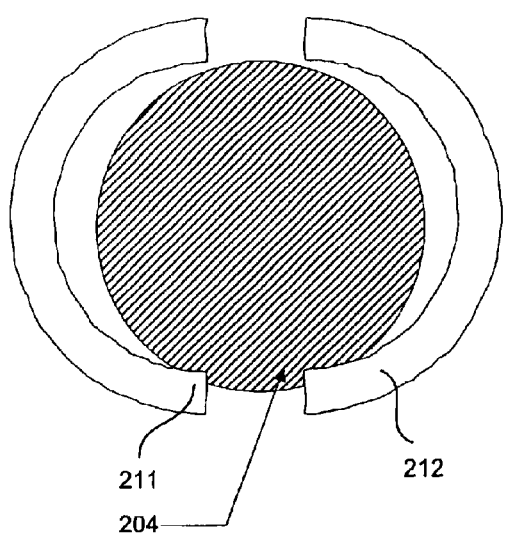
Figure 2D:
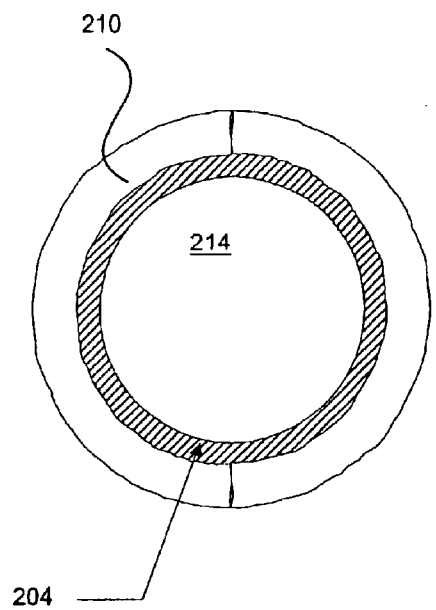

FIG. 2C illustrates a top view of a plasma processing apparatus having a separable gas manifold in accordance with one embodiment of the present invention. As illustrated, in this embodiment the gas manifold has a "clam-shell" configuration to allow the wafer to be inserted into the plasma processing apparatus and to be later removed. As further illustrated, the gas manifold is shown separated into generator portions 211, 212, and positioned near the wafer 204. FIG. 2D is a diagrammatic top view of a plasma processing apparatus, such as that depicted in FIG. 1, with the apparatus and wafer in the closed or process position. The top plate 214 is shown in position over the wafer 204. The toroid like ring 210, comprising separable portions 211 and 212, is shown in the closed position and in place over the wafer 204 to be edge etched. In an alternative embodiment, the wafer is loaded by configuring the plasma generating apparatus to include a top and bottom electrode that moves in the vertical direction to open and close. That is, the plasma apparatus may comprise a gas manifold serving as a top electrode and the wafer chuck serving as the bottom electrode with loading of wafers occurring by moving at least one of the top or bottom electrode to permit insertion of the wafer for processing.

The embodiments of the present invention may be incorporated into existing fabrication tools in many alternative ways. For example, an additional chamber may be added to an existing fabrication cluster tool at a relatively low cost. That is, a tool having multiple process chambers and but one common wafer handling system may be adapted to include an additional chamber to perform the edge etching as described in the embodiments of the present invention for a fraction of the cost of a new tool. For example, Applied Materials, Inc. of Santa Clara, Calif. manufactures the Endura semiconductor fabrication platform. The plasma apparatus of the embodiments of the present invention may be adapted as an additional chamber in the platform or with other available semiconductor fabrication platforms.

The embodiments of the present invention have generally been described with reference to a directional (Reactive Ion Etch) plasma system but should not be interpreted as limiting the invention. It should be appreciated that the embodiments of the present invention may be adapted to work with most or all plasma systems with minor modifications within the knowledge of those of skill in the art. With the arrangements of the present invention, the advantages of the various plasma systems may be combined with an economical and efficient edge etch. For example, Reactive Ion Etching is known as an aggressive form of plasma, having fast etching rates and high uniformity. Direct plasma is a less aggressive form that still places the sample wafer in the RF field. Downstream plasma is a mild process and is suitable for removing thin films. Accordingly, the apparatus and methods described in the various embodiments of the present invention may be applied to different plasma processes according to the characteristics of the edge film to be removed.

By using the focused plasma etching apparatus and methods of the present invention, focused plasma etching of the top edge, backside edge, and bevel of the wafer may be performed to remove films that may flake off during subsequent wafer processing after thin film deposition, etching, or photo masking steps. Further, by using this apparatus, edge etching may be performed in a single step process, eliminating the resist coating and resist stripping processes that are costly and add cycle time to the wafer fabrication process.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A plasma apparatus for generating a plasma to remove film deposits from the edge of a wafer, the apparatus comprising:
   a wafer support comprising a first magnetic field generating source for directing plasma toward the edge of a backside surface of a wafer;
   a top plate for shielding active die portions of an active surface of a wafer from a plasma and having a second magnetic field generating source for directing plasma away from central portions of the wafer and towards the wafer edge; and
   an annular shaped gas distribution manifold to direct generated plasma to the edge of the wafer.

2. The plasma apparatus as recited in claim 1, wherein the top plate is positioned over the active surface of the wafer.

3. The plasma apparatus as recited in claim 1, wherein the gas distribution manifold is toroidal shaped.

4. The plasma apparatus as recited in claim 3, wherein the toroidal shaped gas distribution manifold is "C" shaped in cross section taken in a plane containing the axis of the toroid and wherein the gas distribution manifold is positioned to surround the wafer active surface, edge, and backside surface.

5. The plasma apparatus as recited in claim 1, wherein at least one of the first and second magnetic field generating sources comprises a magnetic coil.

6. The plasma apparatus as recited in claim 1, wherein at least one of the first and second magnetic field generating sources comprises a magnet.

7. The plasma apparatus as recited in claim 6, wherein the plurality of apertures are angled to direct process gases to at least one of a top edge, a backside edge, and a bevel area of the wafer.

8. The plasma apparatus as recited in claim 1, wherein the gas distribution manifold comprises a plurality of apertures for directing plasma process gases towards the wafer.

9. The plasma apparatus as recited in claim 1, wherein the top plate further comprises an inert gas port for providing an inert gas to provide a positive pressure to shield selected areas of the wafer from plasma.

10. The plasma apparatus as recited in claim 1, wherein the top plate, wafer support, and gas distribution manifold are configured to etch deposits from an etch exclusion area on at least one of the top wafer edge, backside wafer edge, and bevel.

11. The plasma apparatus as recited in claim 10, wherein the edge exclusion area is located on the active surface of the wafer from the edge to 1–4 mm from the wafer edge.

12. The plasma apparatus as recited in claim 10, wherein the edge exclusion area is located on the backside surface of the wafer from the edge to 1–8 mm from the wafer edge.

13. The plasma apparatus as recited in claim 1, wherein at least one of the first and second magnetic field generating sources are adjustable magnets.

14. The plasma apparatus as recited in claim 1, wherein the first and second magnetic field generating sources are adjustable magnets.

15. The plasma apparatus as recited in claim 1, wherein at least one of the first and second magnetic field generating sources are adjustable by varying the current through the at least one of the first and second magnetic field generating sources.

16. The plasma apparatus as recited in claim 1, wherein plasma apparatus is configured to perform one of a reactive ion etch, direct plasma, and downstream etch process.

17. The plasma apparatus as recited in claim 1, wherein the wafer support is a wafer chuck.

18. The plasma apparatus as recited in claim 1, wherein the top plate is positioned over the active surface of the wafer so that a gap is formed between the top plate and the wafer.

19. The plasma apparatus as recited in claim 1, wherein the top plate comprises an electrically insulating material.

20. A method for cleaning the edge of a wafer during the manufacture of a semiconductor integrated circuit by directing a plasma to the wafer edge areas, the method comprising:
   generating a plasma from a ring shaped gas distribution manifold directed towards the edge of the wafer;
   shielding active die areas of an active surface of a wafer with a top plate having a first magnetic field generating source;
   using the first magnetic field generating source to confine the plasma to the edge areas of the wafer; and
   using a second magnetic field generating source located in a wafer support to confine the plasma to the edge areas of the wafer.

21. The method for cleaning the edge of a wafer as recited in claim 20 wherein the first and second magnetic field generating sources are magnets.

22. The method for cleaning the edge of a wafer as recited in claim 21 wherein the magnets are electromagnetic coils and are adjustable.

23. The method for cleaning the edge of a wafer as recited in claim 21 wherein the ringed shaped gas generator comprises a plurality of apertures for directing process gases towards the wafer.

24. The method for cleaning the edge of a wafer as recited in claim 23 wherein the plurality of apertures are angled to direct process gases to at least one of a top edge, a backside edge, and a bevel area of the wafer.

25. The method for cleaning the edge of a wafer as recited in claim 20 wherein the ring shaped gas generator is configured in a toroidal shape.

26. The method for cleaning the edge of a wafer as recited in claim 20 further comprising inserting an inert gas over the active die portions of the active surface of the wafer to provide a positive pressure to shield the active die portions of the active surface of the wafer from plasma.

* * * * *